(12) United States Patent
Hasegawa

(10) Patent No.: US 7,247,949 B2
(45) Date of Patent: Jul. 24, 2007

(54) SEMICONDUCTOR DEVICE WITH STACKED CHIPS

(75) Inventor: Hidenori Hasegawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1 day.

(21) Appl. No.: 11/025,065

(22) Filed: Dec. 30, 2004

(65) Prior Publication Data

US 2005/0121773 A1 Jun. 9, 2005

Related U.S. Application Data

(63) Continuation of application No. 10/346,066, filed on Jan. 17, 2003, now Pat. No. 6,852,570.

(30) Foreign Application Priority Data

Jul. 12, 2002 (JP) ............................ 2002-203885

(51) Int. Cl.
*H01L 29/40* (2006.01)
*H01L 23/52* (2006.01)

(52) U.S. Cl. ...................................... 257/777; 257/787

(58) Field of Classification Search ........ 257/777–778, 257/686, 787, E25.013, E27.137
See application file for complete search history.

(56) References Cited

U.S. PATENT DOCUMENTS

| 5,939,817 A | 8/1999 | Takado |
| 6,084,308 A | 7/2000 | Kelkar et al. |
| 6,201,266 B1 * | 3/2001 | Ohuchi et al. ............... 257/106 |
| 6,201,302 B1 | 3/2001 | Tzu |
| 6,204,562 B1 | 3/2001 | Ho et al. |
| 6,236,115 B1 | 5/2001 | Gaynes et al. |

(Continued)

FOREIGN PATENT DOCUMENTS

JP 61-089657 5/1986

(Continued)

OTHER PUBLICATIONS

U.S. Appl. No. 09/797,907, "Semiconductor Device and the Method for Manufacturing the Same".

*Primary Examiner*—Theresa Doan
(74) *Attorney, Agent, or Firm*—Rabin & Berdo, PC

(57) ABSTRACT

A method of manufacturing a semiconductor device which can solve a problem in which a wafer is warped by the influence of thermal contraction of a sealing resin due to a difference in thermal contraction between the wafer and the sealing resin. A second wafer on which electrodes are formed is stacked on a first wafer such that the electrodes of the second wafer are electrically connected to the electrodes formed on the first wafer, a portion between the first wafer and the second wafer is sealed with a resin, the second wafer and the sealing resin are half cut to expose the conductive posts from the sealing resin, conductive bumps for performing electric connection to an external circuit are formed on the exposed conductive posts, and the wafer is diced into independent semiconductor devices. In the resin sealing step, since both the first and second semiconductor elements are stacked in wafer states, a problem in which the wafers are warped by the influence of thermal contraction of the sealing resin due to a difference in thermal contraction between the wafers and the sealing resin can be solved.

11 Claims, 4 Drawing Sheets

U.S. PATENT DOCUMENTS

| | | |
|---|---|---|
| 6,348,728 B1 | 2/2002 | Aiba et al. |
| 6,429,511 B2 | 8/2002 | Ruby et al. |
| 6,525,414 B2 | 2/2003 | Shiraishi et al. |
| 6,545,354 B1 * | 4/2003 | Aoki et al. ................. 257/734 |
| 6,548,891 B2 * | 4/2003 | Mashino ..................... 257/700 |
| 6,559,531 B1 | 5/2003 | Sutherland |
| 6,611,055 B1 | 8/2003 | Hashemi |
| 6,844,619 B2 * | 1/2005 | Tago .......................... 257/686 |
| 6,921,980 B2 * | 7/2005 | Nakanishi et al. .......... 257/784 |
| 2002/0063324 A1 * | 5/2002 | Shiina ........................ 257/690 |
| 2002/0070458 A1 | 6/2002 | Tago |
| 2002/0094601 A1 | 7/2002 | Su et al. |
| 2002/0125556 A1 | 9/2002 | Oh et al. |
| 2002/0180027 A1 | 12/2002 | Yamaguchi et al. |
| 2003/0116859 A1 | 6/2003 | Hashimoto |

FOREIGN PATENT DOCUMENTS

| | | |
|---|---|---|
| JP | 11-177020 | 7/1999 |
| JP | 2001-257310 | 9/2001 |
| JP | 2001345336 | 12/2001 |
| WO | WO98/40915 | 9/1998 |

* cited by examiner

SEMICONDUCTOR DEVICE WITH STACKED CHIPS

CROSS-REFERENCE TO RELATED APPLICATION

This is a continuation of application Ser. No. 10/346,066, filed Jan. 17, 2003 now U.S. Pat. No. 6,852,570.

BACKGROUND OF THE INVENTION

1. Field of the Invention

The present invention relates to a method of manufacturing a semiconductor device which is characterized by a stacking structure of a semiconductor element (chip).

2. Description of the Related Art

With decreases in the size of electronic devices in recent years, when semiconductor devices are packaged, various methods are used which make it possible to package the semiconductor devices at a high integration density. A semiconductor device called a wafer level chip size package (Wafer-level Chip-Package: be to referred to as W-CSP hereinafter)is known. It his a package size that is almost equal to that of a bare chip, or slightly larger than a bare chip.

A feature of the W-CSP will be described below.

A second semiconductor element having a size smaller than that of a first semiconductor element is stacked on the first semiconductor element. On the surfaces of the first and second semiconductor elements, an electronic circuit constituted by a transistor, a resistor, a capacitor, an inductor, and the like is formed. On the surface of the first semiconductor element, a plurality of electrode pads connected to the electronic circuit is formed. On the surface of the second semiconductor element, a plurality of electrodes connected to the electronic circuit is formed. The electrode pads formed on the first semiconductor element are electrically connected to the electrodes formed on the second semiconductor element to transmit electric signals.

A method of manufacturing the W-CSP will be described below.

A wafer which is diced into independent first semiconductor elements in the subsequent steps is prepared. An electric circuit for constituting the first semiconductor elements is formed on the surface of the wafer. Respective second semiconductor elements are placed on the wafer. At this time, electrodes formed on the second semiconductor elements are electrically connected to the electronic circuit formed on the surface of the wafer. Thereafter, the wafer and all the second semiconductor elements are sealed by a sealing resin, and then diced into independent semiconductor devices.

However, in the manufacturing method, the respective second semiconductor elements must be aligned to the wafer, so that the steps are complicated. In addition, since the wafer and the sealing resin are different in thermal contraction, the wafer may warp by the influence of thermal contraction of the sealing resin, disadvantageously.

SUMMARY OF THE INVENTION

The present invention has been made in consideration of the problems, and has as one main object of the present invention to provide a novel and improved method of manufacturing a semiconductor device in which the steps in manufacturing a semiconductor device can be prevented from being complicated. Furthermore, it is another object of the present invention to provide a novel and improved method of manufacturing a semiconductor device which can solve a problem in which a wafer is warped by the influence of thermal contraction of a sealing resin due to a difference in thermal contraction between the wafer and the sealing resin.

In order to solve the problem, according to the present invention, there is provided a method of manufacturing a semiconductor device including the following steps:

forming electrodes, wires, and conductive posts on a first wafer;

stacking a second wafer on which electrodes are formed on the first wafer such that the electrodes of the second wafer are electrically connected to the electrodes formed on the first wafer;

sealing a portion between the first wafer and the second wafer with a resin;

cutting the second wafer and the sealing resin to expose the conductive posts from the sealing resin;

forming conductive bumps for performing electric connection to an external circuit on the exposed conductive posts; and dicing the wafer into independent semiconductor devices.

According to the method of manufacturing a semiconductor device, in stacking second semiconductor elements on the first wafer, when the second wafer is stacked without changing the wafer state, the step of separating the second semiconductor elements from each other, the second semiconductor elements need not be aligned, and the number of steps can be prevented from increasing. In addition, in the step of sealing a portion between the first wafer and the second wafer with a resin, since the first and second semiconductor elements are stacked in wafer states, a problem in which the wafers are warped by the influence of thermal contraction of the sealing resin due to a difference in thermal contraction between the wafers and the sealing resin.

In order to solve the above problem, according to the present invention, there is provided a novel and improved semiconductor device which can reduce the semiconductor device in thickness. In the semiconductor device according to the present invention, on a first wafer, a second wafer having a size smaller than that of the first wafer is stacked. An electrode formed on the first wafer and an electrode formed on the second wafer are electrically connected to each other. A protrude electrode for achieving electric connection to an outside is formed on a step between the first wafer and the second wafer such that the electrode is electrically connected to the electrode formed on the first wafer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments FIGS. 1A and 1B are explanatory diagrams showing the structure of a semiconductor device according to the first embodiment, in which FIG. 1A is a plan view and FIG. 1B is a sectional view along an A—A line in FIG. 1A.

FIGS. 3A and 3B are explanatory diagrams showing the structure of a semiconductor device according to the second embodiment, in which FIG. 3A is a plan view and FIG. 3B is a sectional view along an A—A line in FIG. 3A.

DETAILED DESCRIPTION OF THE PREFERRED EMBODIMENTS

Figure 1A:
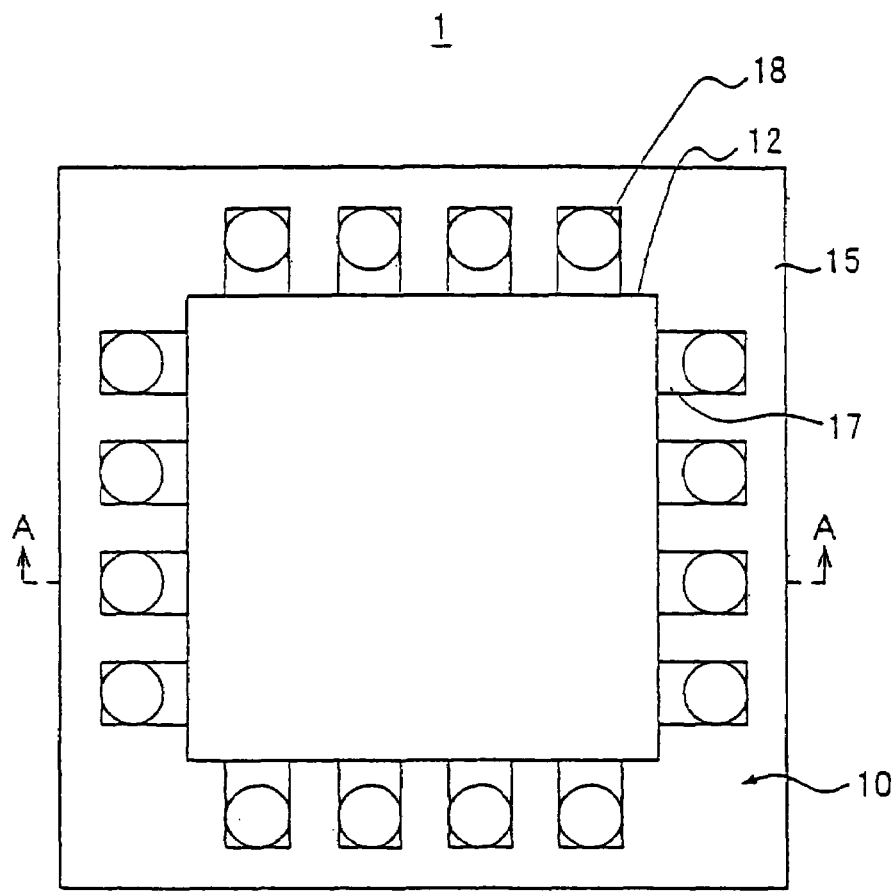

Preferable embodiments of a method of manufacturing a semiconductor device according to the present invention will be described below with reference to the accompanying drawings. The same reference numerals as in this specification and the drawings denote the constituent elements substantially having the same functions in the specification and the drawings.

First Embodiment

Figure 1B:
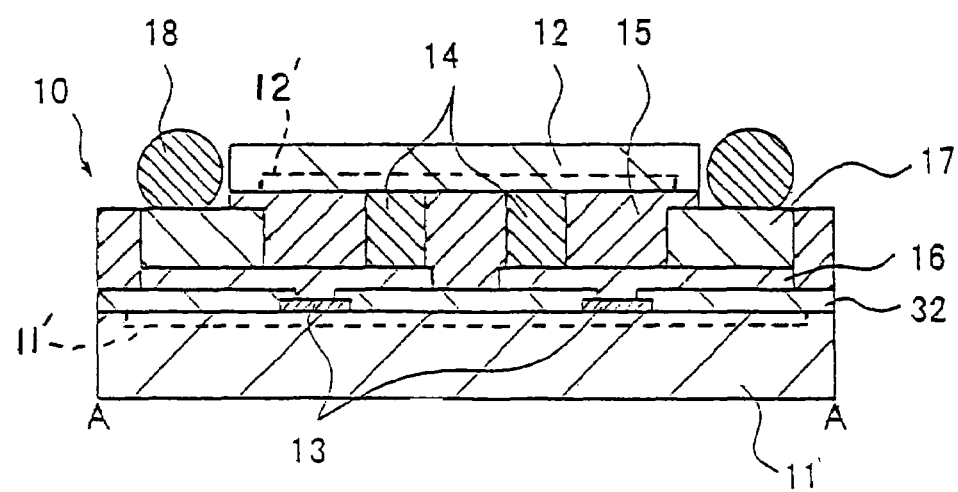

FIGS. 1A and 1B are explanatory diagrams showing the structure of a semiconductor device 1 according to this embodiment. FIG. 1A is a plan view, and FIG. 1B is a sectional view along an A—A line in FIG. 1A.

In the semiconductor device 1 according to this embodiment, as shown in FIGS. 1A and 1B, a second semiconductor element 12 having a size smaller than that of a first semiconductor element 11 is stacked on the first semiconductor element 11. On the surfaces of the first and second semiconductor elements 11 and 12, electronic circuits 11' and 12' constituted by transistors, resistors, capacitors, inductors, and the like are formed. A plurality of electrode pads 13 connected to the electronic circuit 11' are formed on the surface of the first semiconductor element 11. A plurality of electrodes 14 connected to the electronic circuit is 12' are formed on the surface of the second semiconductor element 12.

On the first semiconductor element 11 except for parts of the surfaces of the electrode pads 13, a insulating film 32 consisting of silicon oxide is formed. With this structure, the surfaces of the electrode pads 13 are partially exposed by openings in the insulating film 32. Rewiring layers 16 consisting of, e.g., copper are connected to the electrode pads 13 through the openings of the insulating film 32. The rewiring layers 16 extend from the electrode pads 13 to the lower parts of the metal posts 17 on the insulating film 32. The rewiring layers 16 also extend to the electrodes 14 of the second semiconductor element 12 on the insulating film 32.

The electrode pads 13 of the first semiconductor element 11 are connected to the metal posts 17 through the rewiring layers 16. The heights of the metal posts 17 are smaller than the distance between the first and second semiconductor elements 11 and 12 to expose the metal posts 17 from a sealing resin 15 in the half-cut step. Metal bumps (projecting electrodes) 18 are fixed to the metal posts 17 exposed from the sealing resin 15 such that the metal bumps 18 serve as external terminals for electric connection between the semiconductor device 1 and an external printed wiring board.

A portion between the first and second semiconductor elements 11 and 12 is covered with the sealing resin 15 to be protected from external stress and an environment. In this embodiment, the sealing resin 15 is locally cut (half cut) such that a step 10 is formed between the first semiconductor element 11 and the second semiconductor element 12.

An electric signal from the second semiconductor element 12 and an electric signal from an external device are transmitted through the electrode pads 13, the rewiring layers 16, the metal posts 17, and the metal bumps 18 formed on the first semiconductor element 11.

A method of manufacturing the W-CSP semiconductor device 1 will be described below. FIGS. 2A to 2F are explanatory diagrams showing the method of manufacturing the W-CSP semiconductor device 1 according to this embodiment.

Figure 2A:
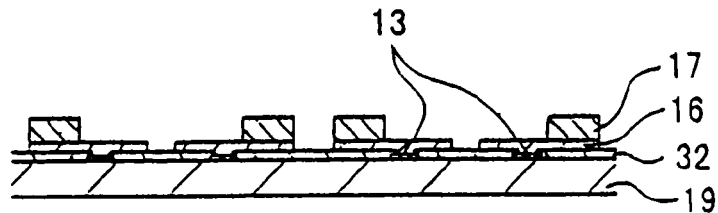
FIG. 2 is an explanatory diagram showing a method of a W-CSP in FIG. 1.

A first wafer 19 shown in FIG. 2A is diced into independent first semiconductor elements 11 in the subsequent steps. On the surface of the first wafer 19, an electronic circuit for constituting the first semiconductor element 11 is formed, and the electrode pads 13, the insulating film 32, the rewiring layers 16, and the metal posts 17 are formed.

Figure 2B:
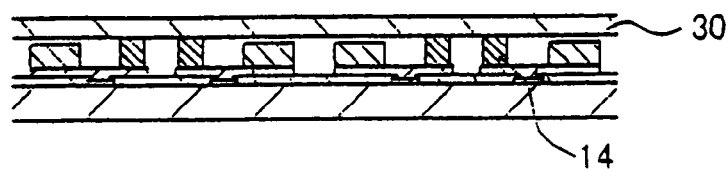
Figure 2C:
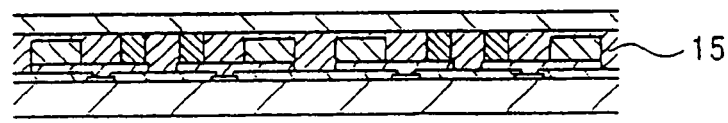

As shown in FIG. 2B, a second wafer 30 is stacked on the first wafer 19. The second wafer 30 is diced into independent second semiconductor elements 12 in the subsequent steps. In this case, the second wafer 30 is stacked such that the electrodes 14 formed on the second wafer 30 are electrically connected to the rewiring layers 16 on the first wafer 19. Thereafter, as shown in FIG. 2C, the first wafer 19 and the second wafer 30 are entirely sealed with a sealing resin 15.

Figure 2D:
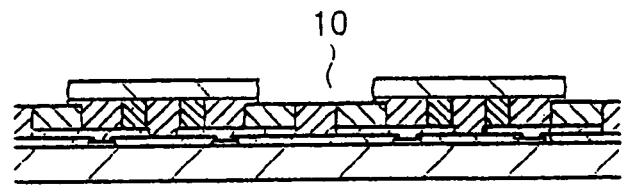
Figure 2E:
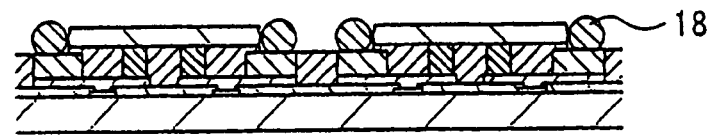

As shown in FIG. 2D, in order to expose the metal posts 17 from the sealing resin 15, the second wafer 30 and the sealing resin 15 are partially cut or half cut. The half cut portion serves as a step 10 when the resultant structure is diced into the independent semiconductor devices 1 in the subsequent steps. Thereafter, on the metal posts 17 exposed by the half cutting process, as shown in FIG. 2E, metal bumps 18 are formed.

Figure 2F:
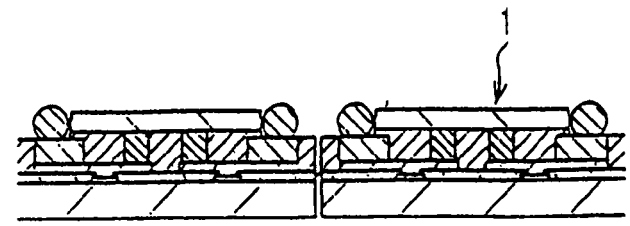

Finally, as shown in FIG. 2F, the resultant structure is diced into independent semiconductor devices.

With the above steps, the semiconductor device 1 shown in FIG. 1 is completed.

Effect of the First Embodiment

As described above, according to the method of manufacturing a semiconductor of this embodiment, when a second semiconductor element is stacked on the first wafer, the second wafer 30 is stacked in wafer state, the step of dicing the second semiconductor elements can be omitted, and the respective second semiconductor elements 22 need not be aligned. An increase in number of steps and complication of the steps can be prevented.

In addition, in the resin-sealing step, both the first and second semiconductor elements are stacked in wafer states. For this reason, a problem in which the wafers are warped by the influence of thermal contraction of the sealing resin due to a difference in thermal contraction between the wafers and the sealing resin can be solved.

Second Embodiment

Figure 3A:
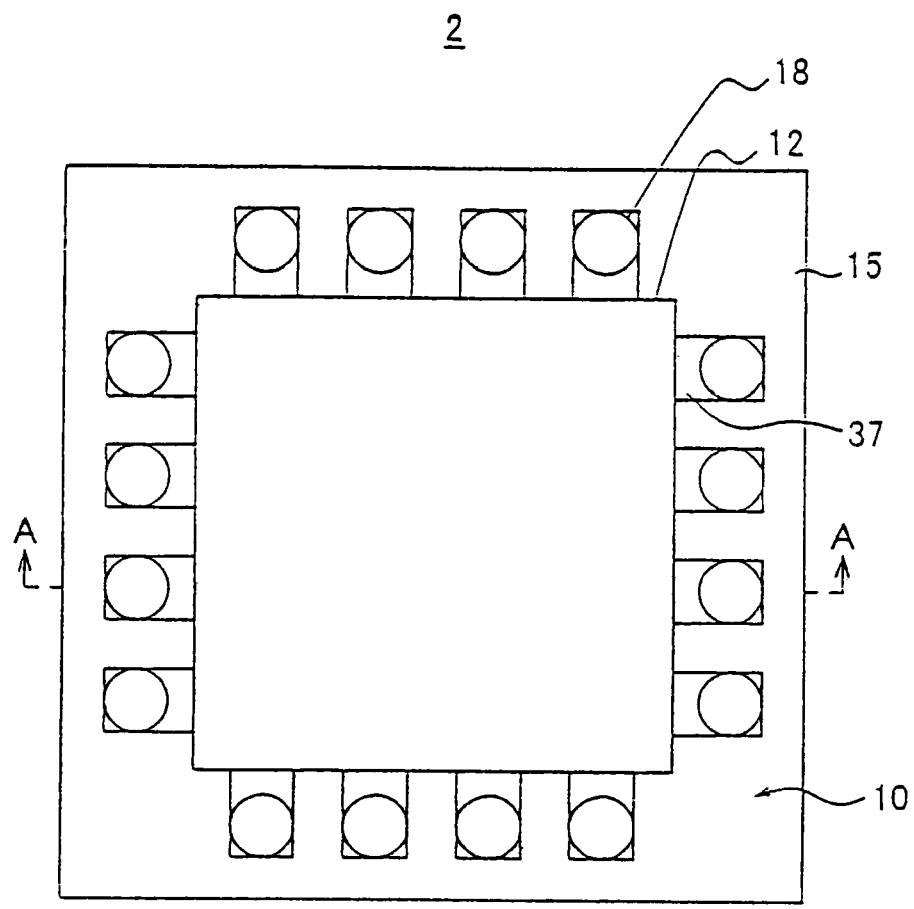
Figure 3B:
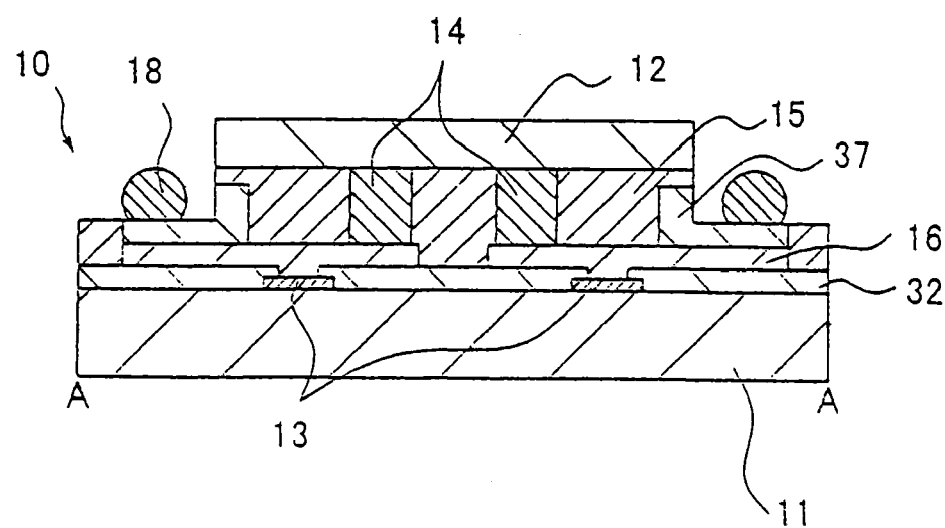

In this embodiment, an application of the first embodiment will be described below. FIGS. 3A and 3B are explanatory diagrams showing the structure of a semiconductor device 2 according to this embodiment, in which FIG. 3A is a plan view and FIG. 3B is a sectional view along an A—A line in FIG. 3A.

The semiconductor device 2 according to this embodiment, as shown in FIG. 3, the second semiconductor element 12 having a size smaller than that of the first semiconductor element 11 is stacked on the first semiconductor element 11. On the surfaces of the first and second semiconductor elements 11 and 12, an electronic circuit constituted by transistors, resistors, capacitors, inductors, and the like is formed. A plurality of electrode pads 13 connected to the electronic circuit is formed on the surface of the first semiconductor element 11. A plurality of electrodes 14 connected to the electronic circuit is formed on the surface of the second semiconductor element 12.

On the first semiconductor element 11 except for parts of the surfaces of the electrode pads 13, a insulating film 32 consisting of silicon oxide are formed. With this structure, the surfaces of the electrode pads 13 are partially exposed by openings regulated by the insulating film 32. Rewiring layers 16 consisting of, e.g., copper are connected to the electrode pads 13 through the openings of the insulating film 32. The rewiring layers 16 extend from the electrode pads 13 to the lower parts of the metal posts 17 on the insulating film 32. The rewiring layers 16 also extend to the electrodes 14 of the second semiconductor element 12 on the insulating film 32.

The electrode pads 13 of the first semiconductor element 11 are connected to the metal posts 37 through the rewiring layers 16. The semiconductor device 2 according to this embodiment is different from the semiconductor device 1 according to the first embodiment, not only the sealing resin 15 but also the metal posts 37 are locally cut (half cut) such that a steps 10 are formed between the first semiconductor element 11 and the second semiconductor element 12. The metal post 37 has a substantially L-shaped section as shown in the sectional view in FIG. 3B. The metal bump 18 is arranged on the substantially L-shaped metal post 37. The metal bump 18 is formed to have a level which is not higher than the level of the rear surface of the second semiconductor element 12.

A portion between the first and second semiconductor elements 11 and 12 is covered with the sealing resin 15 to be protected from external stress and an environment. In this embodiment, the sealing resin 15 is locally cut (half cut) such that a step 10 is formed between the first semiconductor element 11 and the second semiconductor element 12.

An electric signal from the second semiconductor element 12 and an electric signal from an external device are transmitted through the electrode pads 13 formed on the first semiconductor element 11, the rewiring layers 16, the metal posts 37, and the metal bumps 18 formed on the first semiconductor element 11.

As described above, in the structure of the semiconductor device 2 according to this embodiment, the metal post 37 has a substantially L-shaped section, and the metal bump 18 is formed thereon. The level of the metal bumps 18 is set to a level which is not higher than the level of the rear surface of the second semiconductor element 12, so that the semiconductor device 2 can be thinned.

A method of manufacturing the W-CSP semiconductor device 2 will be described below. FIGS. 4A to 4F are explanatory diagrams showing a method of manufacturing the W-CSP semiconductor device 2 according to this embodiment.

Figure 4A:
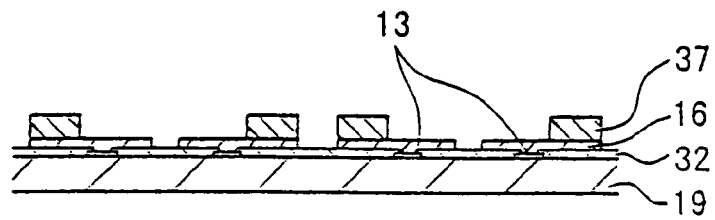
FIG. 4 is an explanatory diagram showing a method of manufacturing the W-CSP in FIG. 3.
Figure 4B:
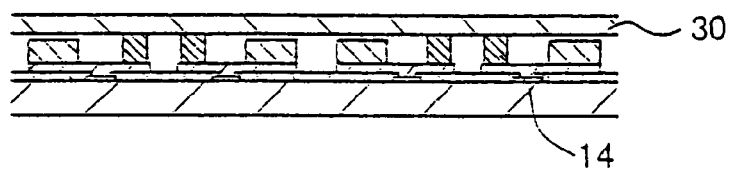
Figure 4C:
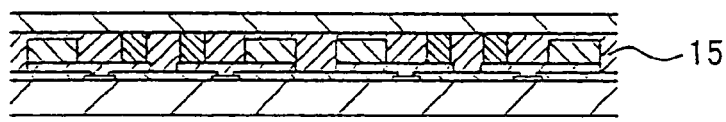

The steps shown in FIGS. 4A to 4C are substantially the same as the steps shown in FIGS. 2A to 2C described in the second embodiment. More specifically, as shown in FIG. 4A, an electronic circuit for constituting the first semiconductor element 11 is formed on the surface of the first wafer 19, and the above electrode pads 13, the insulating film 32, the metal posts 37, and the rewiring layers 16 are arranged. As shown in FIG. 4B, the second wafer 30 is stacked on the first wafer 19. In this case, the second wafer 30 is stacked such that the electrodes 14 formed on the second wafer 30 are electrically connected to the rewiring layers 16 on the first wafer 19. Thereafter, as shown in FIG. 4C, the first wafer 19 and the second wafer 30 are entirely sealed with a sealing resin 15.

Figure 4D:
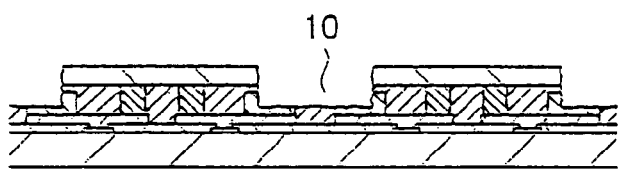

As shown in FIG. 4D, in order to expose the metal posts 37 from the sealing resin 15, the second wafer 30 and the sealing resin 15 are half cut. The half cut portion serves as a step 10 when the resultant structure is diced into the independent semiconductor devices 1 in the subsequent steps.

This embodiment is characterized in that the surfaces of the metal posts 37 are not only exposed but also half cut. As shown in FIG. 4D, the metal post 37 is half cut such that the metal post 37 has a substantially L-shaped sectional shape.

Figure 4E:
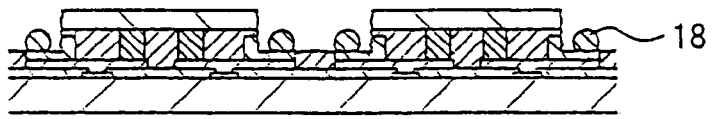

Therefore, on the metal posts 37, as shown in FIG. 4E, the metal bumps 18 are arranged. As shown in FIG. 4E, the shapes of the metal posts 37 and the size of the metal bumps 18 are regulated such that the level of the metal bumps 18 is not higher than that of the rear surface of the second semiconductor element 12.

Figure 4F:
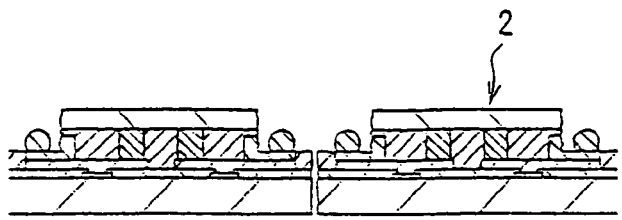

Finally, as shown in FIG. 4F, the resultant structure is diced into independent semiconductor devices.

With the above steps, the semiconductor device 2 shown in FIG. 3 is completed.

Effect of the Second Embodiment as described above, according to this embodiment, in addition to the effect of the method of manufacturing a semiconductor device according to the first embodiment, and the heights of the metal bumps 18 are smaller than the distance between the first wafer 19 and the second wafer 30. For this reason, the manufactured semiconductor device 2 can be thinned.

The preferable methods of manufacturing semiconductor devices according to the present invention have been described above with reference to the accompanying drawings. However, the present invention is not limited to the embodiments. It is apparent that a person skilled in this art can image various changes and modifications without departing from the spirit and scope of the invention. It is understood that these changes and modifications are included in the spirit and scope of the invention as a matter of course.

As has been described above, according to the present invention, the following excellent effects can be obtained.

According to the method of manufacturing a semiconductor device according to the present invention, when a second semiconductor element is stacked on a first wafer, the second wafer can be stacked in a wafer state. For this reason, the step of dicing the second wafer into independent second semiconductor elements can be omitted, and the respective second semiconductor elements need not be aligned, so that an increase in number of steps and complication of the steps can be prevented. In addition, in the resin sealing step, both the first and second semiconductor elements are stacked in wafer states. For this reason, a problem in which the wafers are warped by the influence of thermal contraction of the sealing resin due to a difference in thermal contraction between the wafers and the sealing resin can be solved.

According to the structure of a semiconductor device manufactured by the present invention, since metal bumps for performing electric connection to an external circuit are formed at the steps between a first semiconductor element and a second semiconductor element, the semiconductor device can be thinned. When the heights of the metal bumps are smaller than the distance between the first semiconductor element and the second semiconductor element, the semiconductor device can be further thinned.

What is claimed is:

1. A semiconductor device, comprising:
a first semiconductor chip having a first surface with a first region and a second region, the chip additionally having a first circuit formed in the first region and a first electrode on the first region that is electrically connected to the first circuit, the first semiconductor chip further having a second electrode on the second region, the second electrode being electrically connected to the first electrode;
a second semiconductor chip that is smaller than the first chip, the second chip having a second surface where a second circuit is formed and having a third electrode that is electrically connected to the second circuit, the second chip being stacked on the first chip and the third electrode being electrically connected to the first electrode;
resin disposed between the first and second chips and on the first chip in a region not covered by the second chip,
wherein the resin disposed between the first and second chips has a thickness that is the same as the distance between the first and second chips so as to fill a space between the first and second chips;
wherein the second electrode has an end surface that is even with a surface of the resin disposed in the region not covered by the second chip,
wherein the second electrode has a height that is smaller than the distance between the first and second chips, and
wherein a protruding electrode is attached to the end surface of the second electrode.

2. The semiconductor device of claim 1, wherein the resin on the first chip in a region not covered by the second chip has a thickness that is smaller than the thickness of the resin between the chips.

3. The semiconductor device of claim 1, wherein the second chip has a thickness that is smaller than the thickness of the first chip.

4. The semiconductor device of claim 1, wherein the end surface of the second electrode lies substantially in a first plane, wherein the second chip has a back surface that lies in a second plane, and wherein the protruding electrode has a height that is smaller than the distance between the first and second planes.

5. The semiconductor device of claim 1, wherein the second electrode is generally L-shaped when viewed from a side.

6. The semiconductor device of claim 1, wherein the first electrode and the second electrode are electrically connected by a rewiring conductor to facilitate connections between the electrodes of the chips.

7. The semiconductor device of claim 1, wherein the end surface of the second electrode lies substantially in a plane that passes between the first and second chips.

8. A semiconductor device, comprising:
a first semiconductor chip having a first surface with a first region and a second region, the chip additionally having a first circuit formed in the first region and a first electrode on the first region that is electrically connected to the first circuit, the first semiconductor chip further having a second electrode on the second region, the second electrode being electrically connected to the first electrode;
a second semiconductor chip that is smaller than the first chip, the second chip having a second surface where a second circuit is formed and having a third electrode that is electrically connected to the second circuit, the second chip being stacked on the first chip and the third electrode being electrically connected to the first electrode;
resin disposed between the first and second chips and on the first chip in a region not covered by the second chip, the resin disposed in the region not covered by the second chip having a surface lying substantially in a plane that passes between the first and second chips,
wherein the resin disposed between the first and second chips has a thickness that is the same as the distance between the first and second chips so as to fill a space between the first and second chips;
wherein the second electrode has an end surface that is exposed by the resin disposed in the region not covered by the second chip and that lies substantially in the plane, and
wherein a protruding electrode is attached to the end surface of the second electrode that is exposed by the resin disposed in the region not covered by the second chip.

9. The semiconductor device of claim 8, wherein the plane is a first plane, wherein the second chip has a back surface that lies in a second plane, and wherein the protruding electrode has a height that is smaller than the distance between the first and second planes.

10. The semiconductor device of claim 8, wherein the second electrode is generally L-shaped when viewed from a side.

11. The semiconductor device of claim 8, wherein the second electrode has a height that is smaller then the distance between the first and second chips.

* * * * *